June 17, 1969 A. LORO 3,449,825

FABRICATION OF SEMICONDUCTOR DEVICES

Filed April 21, 1967

United States Patent Office 3,449,825
Patented June 17, 1969

3,449,825

FABRICATION OF SEMICONDUCTOR DEVICES

Alberto Loro, Ottawa, Ontario, Canada, assignor to Northern Electric Company Limited, Montreal, Quebec, Canada Filed Apr. 21, 1967, Ser. No. 632,641
Int. Cl. H01l 7/66
U.S. Cl. 29—578 10 Claims

ABSTRACT OF THE DISCLOSURE

An improvement in the beam lead process in which the metallic layer (platinum and titanium) on which the beam leads (gold) are electrodeposited is divided into separate sections before the plating step, thus avoiding the difficulties hitherto experienced in removal of the metallic layer from between the beam leads after they have been formed.

To ensure uniformity of plating potential on these separate sections, a continuous conducting region (grid) is formed in the substrate assembly, and each section of the metallic layer is connected to an individual portion of this conducting region during the electrodeposition step. Subsequently such portions of the conducting region are etched away on removal of the areas of the substrate assembly around each device.

This invention relates to improvements in the fabrication of so-called beam lead semiconductor devices, i.e. transistors, diodes, so-called integrated or microcircuits and similar miniaturised electronic components.

The beam lead process was first described by M. P. Lepselter in The Bell System Technical Journal, vol. XLV, No. 2, pp. 233–253 (February 1966), and subsequently in a revised form by the same author in the Bell Laboratories Record for October/November 1966, at pp. 299, 303.

The beam lead process as disclosed by Lepselter involves the application of relatively massive metallic leads to planar diffused silicon transistors while still in slice form, that is, before separation into discrete chips. After separation into separate devices, the beam leads project beyond the boundaries of each device, simultaneously providing means for supporting the device physically, means for establishing electrical connections with the active component regions thereof, and means for dissipating heat by thermal conduction. Beam leads thus replace conventional bonded wire connections, at the same time eliminating the need for a wafer bonding operation. They offer substantial cost reduction, together with increased reliability. Other advantages include improved sealing against contaminants.

The present invention is concerned with an improved method of forming beam leads during the fabrication of semiconductor devices.

As hitherto practiced the beam lead process involves the building up of relatively massive leads (e.g. about 12 microns thick) by the electrodeposition of gold onto a continuous, relatively thin, metallic layer (e.g. platinum and titanium) covering the oxidised layer on a silicon slice. During this electrodeposition step the pattern of the beam leads is defined by a photoresist mask that covers the remainder of the metallic surface.

The function of the metallic layer beneath the gold is two-fold. Firstly, it provides an essential part of the metallurgy of the final product (e.g. adequate connection both mechanically and electrically). Secondly, it provides a highly conductive layer for use during the electrodeposition step, thereby insuring a uniform deposition potential and a uniform build-up of the gold leads. It is because of the presence of this continuous metallic layer during the gold electrodeposition step, as a necessary adjunct in the control of that operation, that a non-conducting mask is required to restrict the deposition to the areas where the beam leads are to be formed.

The use of a mask at this stage of the process has certain disadvantages, however, and this step in the process is a very delicate one to carry out. Moreover, the subsequent need to remove those portions of the metallic sublayer that lie between the gold beam leads, once these have been formed, is difficult, since platinum is much more difficult to etch than gold, and there is a tendency to undercut the gold leads. Various methods have been developed for avoiding or minimising these difficulties, but they have all involved additional complications.

In accordance with the preferred form of the present invention, the metallic layer onto which the beam leads are electrodeposited is etched before the electrodeposition step to leave only a plurality of mutually separate sections defining the beam lead pattern. The beam leads can then be electrodeposited directly onto these sections of the metallic layer without any need to mask the remaining surface of the workpiece, since this remaining surface will now consist of the non-conducting oxide layer. In this way, one avoids both the need for masking at the electrodeposition stage, as well as the need for subsequent removal of intermediate portions of the metallic layer in the presence of gold.

There remains, however, the need to ensure a uniform plating potential on the various sections to the metallic layer on which the gold is to be deposited, which sections are now physically separated from each other. This object is achieved in the present invention by providing a conducting region in the device itself, i.e., in the substrate assembly below the oxide layer, and establishing a connection between discrete portions of such region and each of the sections of the metallic layer that define the beam lead pattern. In this way the plating potential on such sections can be closely controlled. This conducting region in the device extends through areas that are relatively remote from the active component regions of the device, so that at least its portions that made contact with the beam leads can be removed after the electrodeposition step, e.g. by inversion of the device and etching away of the substrate in such areas. It is practicable to arrange that the substrate areas thus etched away are those that would have had to be removed in any event to separate each device from its neighbours on the slice.

Thus, in its broad concept, the invention may be defined as a method of fabricating a beam lead semiconductor device comprising the steps of (a) forming at a surface of a substrate assembly at least two active component regions, (b) forming at said surface a conducting region displaced from said active component regions, (c) providing an insulating layer over said surface with windows extending through said layer, one of said windows communicating with each of said active component regions and further ones of said windows communicating each with a discrete portion of said conducting region, (d) forming superposed on said insulating layer a plurality of mutually separate sections of a metallic layer, a part of each said section extending through a said window into electrical contact with a respective one of said active component regions and another part of each said section extending through a said window into electrical contact with a respective one of said portions of the conducting region, (e) then immersing said metallic layer sections in a plating bath while connecting a plating potential to said conducting region to electrodeposit a mass of further metal on each of said layer sections to form a beam lead on each said section, (f) and finally removing the portion of said substrate assembly containing said conducting region portions to isolate the beam leads from each other while leaving them electrically connected to their respective active component regions.

Various manners in which the present invention can be carried into practice are illustrated diagrammatically, and by way of example only, in the accompanying drawings, in which:

FIGURES 1 to 7, respectively, show in cross-section successive stages in the construction of epitaxial transistors with beam leads in accordance with the present invention;

With reference to FIGURES 1 to 9, these views demonstrate the fabrication of one of a group of silicon epitaxial beam lead NPN transistors. It will be appreciated that a PNP transistor can be fabricated in essentially the same way, with merely the conductivity type of the various regions reversed.

Figure 1:
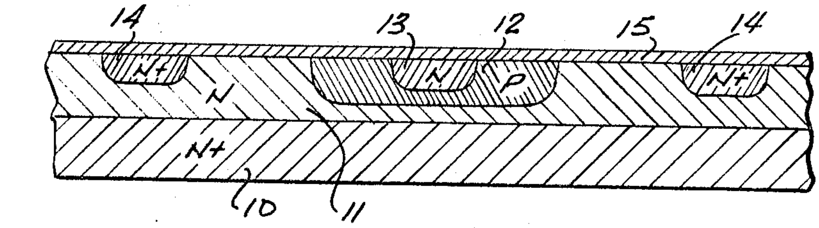

FIGURE 1 shows a low resistivity, N type substrate 10, i.e. an N+ region. This substrate 10 supports an epitaxial N type collector region 11 which, together with the region 10 constitutes a substrate assembly. Into the collector region 11, there is diffused a P type base region 12, and, in turn, an N type emitter region 13 is diffused into the base region 12. So far, the manner of fabrication of the transistor is conventional, and it will be understood that in practice a large number of similar transistors will be formed simultaneously on the same slice, that is to say with a common substrate assembly 10 and 11.

In accordance with one form of the present invention, a modified emitter mask is used during formation of the emitter region 13, in order simultaneously to diffuse into the collector region 11 a low resistivity, N type conducting region in the form of a grid 14, this low resistivity being achieved by doping the region strongly, i.e. as an N+ region. The manner in which the area 14 constitutes a grid of two mutually perpendicular series of parallel strips is perhaps best appreciated from FIGURE 8. It will be appreciated that the grid 14 will completely surround the transistor shown sectioned in FIGURE 8 and that it will, in a like manner, surround and separate from its neighbours each of the other transistors formed on the slice.

An insulating silicon oxide coating 15 covers the entire outer surface of the substrate assembly (slice) at the stage shown in FIGURE 1.

Figure 2:
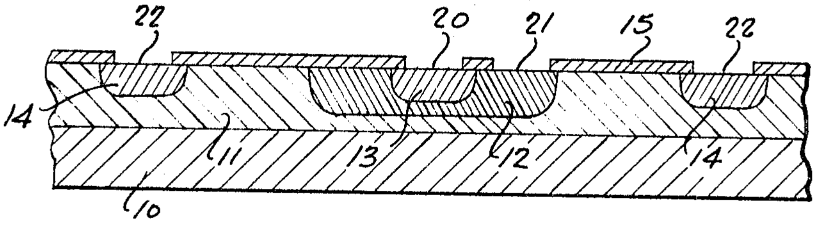

The next stage, which is illustrated in FIGURE 2, is to etch contact windows for the active component regions, i.e. the emitter 13, base 12 and collector 11, as well as for two discrete portions of the conducting region, i.e. the grid 14. The emitter window 20, base window 21, and grid windows 22 are seen in FIGURE 2. The collector window is not visible in this view, since it is behind the plane in which the section is taken. It is, however, the same as the other windows, with the exception that it provides access to the collector region 11. It lies beneath the structure shown generally at 23 in FIGURE 8. This etching process is carried out in a conventional manner, using a contact window etching mask which will be conventional except for having holes for making the grid windows 22.

Figure 3:
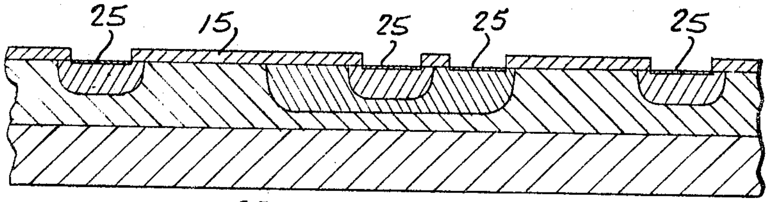
Figure 4:
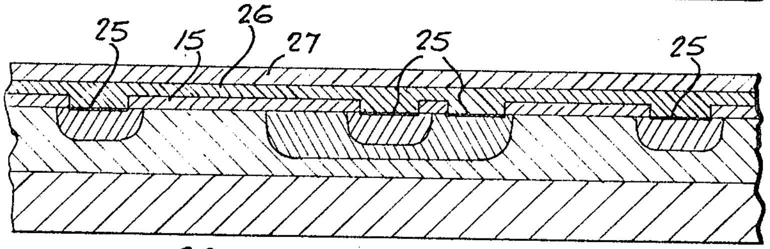
Figure 5:
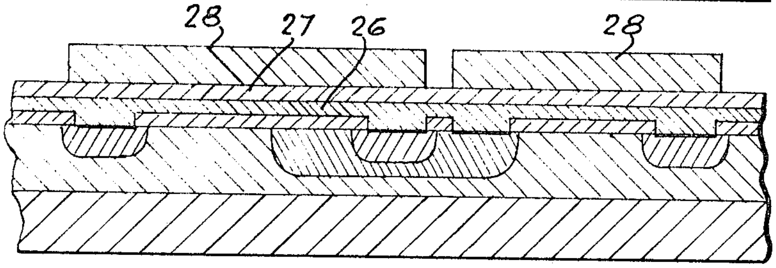
Figure 6:
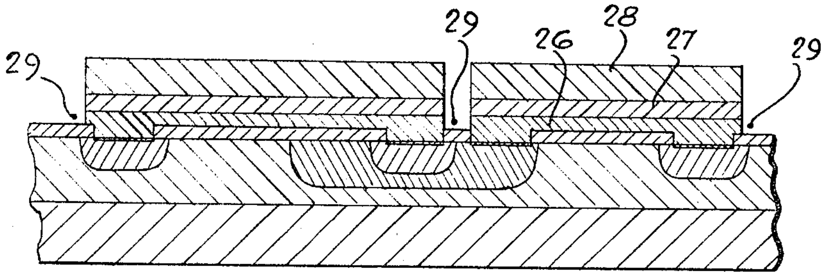

The next stage in the process is to deposit a thin layer, e.g. 0.07 micron, of platinum by sputtering or evaporation over the entire surface of the device. This step is carried out at a high temperature, for example 650° C., or may be carried out cold and followed by a heat treatment at between 500–800° C. At high temperature the platinum that enters the windows reacts with the silicon to form platinum silicide. Platinum silicide is an excellent contact material, since it is one of the most stable compounds of silicon. It resists corrosion well and forms a contact that has a low and constant resistance. Once platinum silicide contacts 25 have thus been formed, the remaining platinum deposited over the oxide layer 15 is etched away, leaving the inert platinum silicide contacts 25 in the windows as shown in FIGURE 3.

The next step is to deposit by sputtering or evaporation a thin layer 26 of titanium (e.g. 0.15 micron thick) over the entire outer surface of the device, that is to say both over the oxide layer 15 and also into the windows to come into contact with the platinum silicide contacts 25. Titanium reacts with the silicon dioxide of layer 15 to form a strong bond. If a silicon nitride layer has also been formed in the insulating layer 15 (as is conventional practice), the titanium also bonds well to it. The titanium layer tends to improve the insulating properties of the dielectric layer 15 by absorbing reaction products and impurities. Also it remains stable at high temperatures. Also of importance is the fact that the titanium establishes an excellent connection with the platinum silicide contacts 25.

Since it will normally be desired to use gold as the final metal with which to form the beam leads themselves, and since gold reacts chemically with titanium at relatively low temperatures, an intermediate thin platinum layer 27 (e.g., 0.35 micron thick) is first sputtered or evaporated over the entire titanium layer 26. The platinum layer 27 does not react chemically with either of the other metals (titanium and gold) or with oxygen, and it is easily bonded to the outer layer of gold without excessive diffusion of the gold into it. The stage of the process shown in FIGURE 4 has now been reached.

A photoresist mask 28 (FIGURE 5) is now applied to the device to obscure the areas that the beam leads are ultimately required to occupy. The portions of the metallic layer 27, 26 exposed by the mask 28 are now etched away by conventional etching processes. This is shown done in FIGURE 6, the etched away areas being partially identified at 29.

Figures 7, 8, 9, 10, 11:
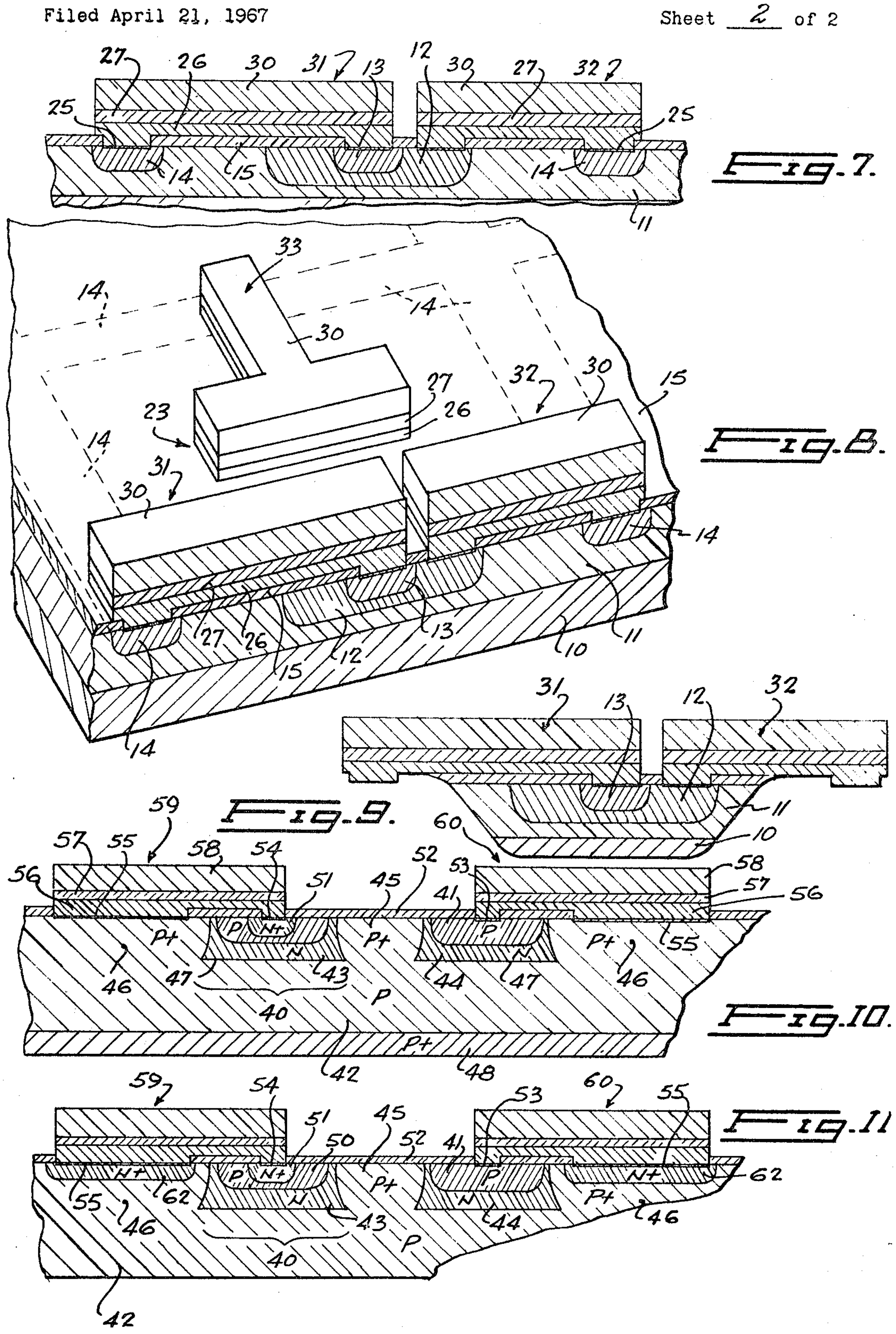
FIGURE 8 is a perspective view corresponding to FIGURE 7.
FIGURE 9 is a further cross-section showing the final structure of a transistor.
FIGURE 10 is a cross-section of a microcircuit demonstrating another application of the present invention.
FIGURE 11 is a cross section of another microcircuit demonstrating a further application of the present invention.

The photoresist mask 28 is then removed to expose the hitherto covered sections of the platinum layer 27 (which sections now define the beam lead contours) and relatively massive (e.g., 12 microns thick) layers of gold 30 are now electrodeposited on each of these mutually separate sections of the metallic layer to form beam leads 31, 32 and 33 for the emitter 13, base 12 and collector 11 respectively (FIGURES 7 and 8).

After the beam leads have thus been formed, the excess silicon of the substrate assembly is etched away as shown in FIGURE 9, this step serving both to isolate the individual transistors from one another on the slice and also to remove the ohmic silicon interconnection that previously existed between the now free ends of the beam leads. While only the beam leads 31 and 32 can be seen in FIGURE 9, it will be appreciated that the beam lead 33 lies behind them, as in FIGURE 8, and that, in a similar manner, the end of such beam lead 33 that previously made contact with a portion of the grid 14 is now free. This final substrate removal step in the process is carried out by turning the slice over, placing an etch mask over the portions of the slice containing the transistors themselves and then etching away all the silicon outside the mask. While in practice this step will normally remove all of the conducting region (grid 14), it will be apparent that it is sufficient for operability if only those portions of the grid 14 contacted by the beam leads are removed, in order to isolate such leads electrically from each other.

In the known process for fabricating beam leads on semiconductor devices a non-conducting mask is required at the electrodeposition stage to define the area to be plated. By contrast, in the present invention, the area to be electroplated with gold is the only conducting surface presented to the plating bath. It is, of course, assumed that the back surface of the slice will not be allowed to come into contact with the electrolyte. In view of the very high resolution found necessary in the plating mask for carrying out the known process, the foregoing difference represents an important advantage. The reason this advantage can be realised lies in the fact that the present process provides the conducting grid 14 which plays a critical role in the process. During the electrodeposition step each of the beam leads is electrically connected to this grid through a contact 25. The other pole of the plating bath, i.e., the plating potential relative to that of the electrolyte, can then be connected either directly to this grid 14, or indirectly to it by virtue of being connected to the substrate assembly 10, 11. The presence of the grid 14 will ensure that the various separate sections of the metallic layer 26, 27 are at substantially the same deposition potential as each other and will therefore plate uniformly.

In the prior art process, which lacks the grid 14, the current path to the platinum surface on which the gold is electrodeposited has to be conveyed to the required parts of that surface from the exterior through the platinum layer itself (or through some other metallic layer beneath, such as the titanium layer). The current could not be brought through the substrate assembly to individual sections of the platinum layer, without incurring the disadvantage that this assembly would tend to exhibit a low resistance to some of the sections, for example, those connected to the collectors (to which the potential would be virtually directly connected) while showing a much higher resistance to those sections connected to the bases and emitters where the plating current would have to pass through one or more PN junctions (including one forward and one reverse biased in the case of a connection through an emitter). Such a wide variation of resistance would lead to variations in the plating potential and an unacceptable non-uniformity of deposition of the gold. Consequently it was necessary in the prior art process to provide an alternative, low resistivity current route through the superposed metallic layer. This requirement prevented such layer being subdivided into separate sections prior to plating. On the other hand, retention of the entire metallic layer during the electrodeposition step led to the need both for a non-conducting mask to define the outlines of the beam leads during plating, as well as for subsequent removal of those portions of the metallic layer lying between the beam leads, after such leads had been formed. This latter step is substantially more difficult to carry out than the step of etching away certain parts of the metallic layer, which is carried out in the present process before the gold is electrodeposited. Indeed, the difficulties of removing the platinum between the beam leads once the gold is in place (platinum being more difficult to etch than gold, especially without undercutting the narrow gold fingers) stimulated the development of a new technique known as "back-sputtering." This is a very delicate technique, however, and an important advantage of the present process is that it renders this deliacte technique unnecessary.

FIGURE 10 shows an application of the process to a semiconductor device in the form of a miniaturised integrated circuit, i.e., a so-called microcircuit, the active units of which, in the simple example taken, consist, respectively, of a transistor 40, and a diffused resistor 41, such units being formed to remain on the same chip when the slice is subsequently divided into separate chips. Region 42 is a P type substrate on which two N type epitaxial islands 43 and 44 are formed. These islands 43 and 44 are actually formed by first depositing an N type epitaxial layer over the entire surface of the substrate 42, and then separating the continuous N type layer so formed into islands by applying a heavy and deep, P type, diffused pattern which penetrates right through the N type layer into the P type substrate 42. The P+ regions 45 and 46 thus formed join up to form a continuous "grid" surrounding each island 43, 44 much like the N+ grid 14 already described. The P+ regions 45 and 46 thus act to separate the N type islands 43, 44, the regions 45 providing separation between the active units of a single device, while the regions 46 provide separation between adjacent circuits (devices) on the slice. The regions 46 also function as a conducting region or grid for use in the plating stage in the process, analogous to the function of the grid 14 of FIGURES 1 to 9. It will be noted that each of the N type islands 43 and 44 is now surrounded by a PN junction 47.

The sheet resistivity of the P+ type separation diffusion regions 45, 46 is typically a few ohms per square, which is low compared to the transverse resistance of the substrate 42 (e.g. a 5 mil slice of 5 ohm cm. material has a sheet resistivity of 400 ohms per square). Hence, the conductive grid effectively constituted by the regions 45, 46 may be fabricated conveniently during isolation diffusion. This grid is then electrically continuous with the substrate 42 which makes a further minor contribution to transverse conduction. The transverse conduction of the substrate 42 may be enhanced, without detriment or additional processing, by ensuring that the back of the slice is exposed to the heavy P type isolation diffusion to form a P+ type back layer 48. This results in electrical continuity between the P+ grid 45, 46, the P type substrate 42 and the P+ back layer 48. Hence electrical connection for electrodeposition at a later stage of the process may be made either to the back of the slice (i.e. layer 48) or to any part of the grid 45, 46.

The remainder of the process is similar to that already described in connection with FIGURES 1 to 9. The transistor 40 includes a P type diffused base region 50 with an N+ type emitter region 51 diffused thereinto. The resistor 41 consists of a P type diffused region. The oxide layer is shown at 52, and resistor and emitter platinum silicide contacts 53 and 54 respectively are shown formed in windows in the layer 52, as in the transistor of FIGURES 1 to 9. Contacts 55 are similar platinum silicide contacts to the grid 46. As before, they are covered by a metallic layer constituted by a titanium layer 56 and a platinum layer 57. Finally, a gold layer 58 is electrodeposited to form the beam leads proper, only the emitter beam lead 59 and a resistor beam lead 60 being shown in FIGURE 10. Base and collector beam leads and a second resistor beam lead will be simultaneously formed in a like manner in planes other than that is which the section of FIGURE 10 is taken.

FIGURE 11 shown a modification of FIGURE 10, in which, as before, N type epitaxial islands 43 and 44 are formed in a P type substrate 42. Also, as before, P+ type separating regions 45 and 46 are formed. However, in this form of the invention, the regions 45, 46 no longer act as the conducting grid for the electrodeposition step. For this purpose there is now formed a grid 62 of N+ conductivity, this grid 62 being formed during diffusion of the N+ emitter region 51. The remainder of the parts of FIGURE 11 are essentially the same as in FIGURE 10 and have been similarly designated. In this case transverse conduction during the electrodeposition step is almost entirely due to the low resistivity of the conducting grid 62, since the substrate 42 is separated therefrom by the PN junctions that surround the grid 62.

In both the examples of FIGURES 10 and 11, the final process step is to invert the slice and etch away the substrate assembly between devices to separate them from one another and to leave free the ends of the beam leads in a manner analogous to FIGURE 9.

In general, the sheet resistivities of the separating and emitter diffusions are quite similar, from which it might appear that the method of FIGURE 10 is to be preferred over that of FIGURE 11, because of the common conductivity between the grid 45, 46, substrate 42 and back diffusion layer 48 acting in parallel. However, the shallower emitter type diffusion grid 62 has a much higher surface concentration, which may result in lower and more uniform contact resistance to the beam leads. Thus the method of FIGURE 11 may be preferred for this reason. In this case electrical connection of the plating potential during the electrodeposition step must be made directly to some part of the N+ grid 62.

As already explained in connection with the transistors of FIGURES 1 to 9, it is to be similarly understood that in the microcircuits of FIGURES 10 and 11 the conductivity types may be reverse.

While it has been convenient to describe the invention in relation to the specific metals that it is preferred to use, it should be stated that the principle of the invention is equally applicable to the fabrication of beam lead devices when different metals are employed. For example, instead of gold, the outer layer that forms the beam lead proper may be formed of nickel, or silver, or both, or even platinum. As far as the underneath metallic layer is concerned, while a titanium and platinum combination has certain advantages, these metals can be replaced by any one or more metals that will provide simultaneously the required characteristics of reasonable corrosion resistance; good bonding with the contact surfaces (e.g. platinum silicide) and with the oxide layer; and providing an adequate base for the outer layer. For example, chromium could replace titanium. While gold can be plated directly onto chromium, it would be preferable to provide an intermediate layer of nickel.

Another alternative is the use of molybdenum applied directly onto the oxide layer and into contact with the silicon in the windows. This molybdenum would replace the platinum and titanium layers. A thin layer of gold can be evaporated or sputtered onto the molybdenum, with a final thick layer of gold applied by plating.

By the same token, the invention is not restricted to any particular form of substrate assembly. In addition to silicon based semiconductor devices, beam leads can be used in a variety of applications. See for example the reference to the use of this principle in planar beam lead gallium arsenide electroluminescent arrays (W. T. Lynch et al., paper presented at International Electron Devices Meeting, Washington, Oct. 26–28, 1966 entitled "Planar Beam Lead GaAs Electroluminescent Arrays"—see abstract No. 4.4).

The invention is not limited to devices formed by the planar diffusion process, but extends to devices in which the active component regions are formed by epitaxial deposition.

I claim:

1. In a method of fabricating a beam lead semiconductor device, the steps of (a) forming at a surface of a substrate assembly at least two active component regions, (b) forming at said surface a conducting region displaced from said active component regions, (c) providing an insulating layer over said surface with windows extending through said layer, one of said windows communicating with each of said active component regions and further ones of said windows communicating each with a discrete portion of said conducting region, (d) forming superposed on said insulating layer a plurality of mutually separate sections of a metallic layer, a part of each said section extending through a said window into electrical contact with a respective one of said active component regions and another part of each said section extending through a said window into electrical contact with a respective one of said portions of the conducting region, (e) then immersing said metallic layer sections in a plating bath while connecting a plating potential to said conducting region to electrodeposit a mass of further metal on each of said layer sections to form a beam lead on each said section, (f) and finally removing the portion of said substrate assembly containing said conducting region portions to isolate the beam leads from each other while leaving them electrically connected to their respective active component regions.

2. A method according to claim 1, (g) wherein said substrate assembly comprises a slice on which a plurality of said semiconductor devices are formed simultaneously, (h) and wherein said conducting region comprises a grid defining discrete areas of said slice, (i) one such device being formed in each said area whereby said step of removing the portion of the substrate assembly containing the conducting region also serves to separate the devices from one another.

3. A method according to claim 1, (g) wherein said semiconductor device comprises an epitaxial transistor, said active component regions comprising a portion of said substrate assembly constituting a collector region and being of a first conductivity type, a base region of the other conductivity type formed in said collector region, and an emitter region of the first conductivity type formed in said base region, (h) said conducting region being formed in said collector region and having the same conductivity type as said collector region, while being more heavily doped than said collector region to ensure a low resistivity for said conducting region.

4. A method according to claim 1, (g) wherein said substrate assembly comprises a slice on which a plurality of said semiconductor devices are formed, each said device comprising an epitaxial transistor, (h) the active component regions of each said transistor comprising a portion of said slice constituting a collector region and being of a first conductivity type, a base region of the other conductivity type formed in said collector region, and an emmitter region of the first conductivity type formed in said base region, (i) said conducting region comprising a grid formed in said slice and having the same conductivity type as said collector regions, while being more heavily doped than said collector regions to ensure a low resistivity for said grid, (j) said grid defining discrete areas of said slice with one of said transistors formed in each of said areas whereby said step of removing the portion of the substrate containing the conducting region comprises removing the portion of the slice containing the grid while simultaneously separating the transistors from other.

5. A method according to claim 1, (g) wherein said substrate assembly comprises a slice on which a plurality of said semiconductor devices are formed, (h) each said semiconductor device comprising a micro-circuit containing at least two electrically separate active units, each said active unit containing at least one of said active component regions, (i) said slice comprising a main region of a first conductivity type, and said active units each including at least one region of the other conductivity type formed in said slice, (j) the surface of said slice including a plurality of separating regions of said first conductivity type but more heavily doped than said main region of said slice, said separating regions serving both to separate said semiconductor devices from each other on the slice as well as to separate said active units of each semiconductor device from each other, those of said separating regions that separate said devices from each other constituting said conducting region.

6. A method according to claim 1, (g) wherein said substrate assembly comprises a slice on which a plurality of said semiconductor devices are formed, (h) each said semiconductor device comprising a micro-circuit containing at least two electrically separate active units, each said active unit containing at least one of said active component regions, (i) said slice comprising a main region of a first conductivity type, and said active units each including at least one region of the other conductivity type formed in said slice, (j) the surface of said slice including a plurality of separating regions of said first conductivity type but more heavily doped than said main region of the slice, said separating regions serving both to separate said semiconductor devices from each other on the slice as well as to separate said active units of each semiconductor device from each other, (k) said conducting region comprising a grid formed in those of said separating regions that separate said devices from each other, said grid being heavily doped and of the opposite conductivity type from said main slice region.

7. A method according to claim 6, (l) wherein one of said active units of each device comprises a transistor having active component regions comprising a collector region of said opposite conductivity type, a base region of the first conductivity type formed in said collector region, and an emitter region of said opposite conductivity type formed in said base region, (m) and wherein said conducting region is formed simultaneously with formation of said emitter regions.

8. A method according to claim 1, (g) wherein said substrate assembly comprises a silicon substrate assembly, (h) and wherein said metallic layer sections formed by said step (d) are formed by (i) forming platinum silicide contacts on said silicon substrate assembly in each of said windows, (ii) forming a first layer of titanium extending over the insulating layer and into electrical contact with said platium silicide contacts, (iii) superposing on said titanium layer a platinum layer to cover the entire said titanium layer, (iv) and then removing portions of said platinum and titanium layers to leave sections thereof to constitute said mutually separate metallic layer sections, each of said sections extending between a respective one of said active component regions and a respective one of said discrete portions of the conducting region.

9. A method according to claim 8, wherein said further metal electrodeposited onto the metallic layer in step (e) is gold.

10. In a method of fabrication of a beam lead semiconductor device, the steps of (a) forming at a surface of a silicon substrate assembly at least two active component regions, (b) forming at said surface a conducting region displaced from said active component regions, (c) providing an insulating layer over said surface with windows extending through said layer, one of said windows communicating with each of said active component regions and further ones of said windows communicating each with a discrete portion of said conducting region, (d) applying a layer of platinum over said insulating layer to extend into said windows and react with said silicon substrate assembly to form platinum silicide contacts, (e) removing said platinum layer while leaving intact said platinum silicide contacts, (f) applying a layer of titanium over said insulating layer and into electrical and physical connection with said platinum silicide contacts, (g) applying a layer of platinum over said titanium layer to form therewith a metallic layer, (h) selectively removing portions of said metallic layer to leave mutually separate sections of such layer such that a part of each said section extends into electrical contact with a said platinum silicide contact on a respective one of said active component regions, while another part of each said section extends into electrical contact with a said platinum silicide contact on a respective one of said discrete portions of said conducting region, (i) then immersing said metallic layer sections in a gold plating bath while connecting a plating potential to said conducting region to electrodeposit a relatively massive amount of gold on the outer platinum surface of each of said sections to form a beam lead on each said section, (j) and finally removing the portion of said substrate assembly containing said conducting region portions to isolate the beam leads from each other while leaving them electrically connected to their respective active component regions.

References Cited

UNITED STATES PATENTS

| | | | |
|---|---|---|---|
| 3,287,612 | 11/1966 | Lepselter | 317—235 |
| 3,386,894 | 6/1968 | Steppat | 29—590 X |

JOHN F. CAMPBELL, *Primary Examiner.*

D. C. REILLY, *Assistant Examiner.*

U.S. Cl. X.R.

29—580, 590; 148—1.5; 204—40; 317—235